(12) United States Patent
Yang et al.

(10) Patent No.: US 10,818,322 B2
(45) Date of Patent: Oct. 27, 2020

(54) TOOL-LESS QUICK ASSEMBLY AND DISASSEMBLY DEVICE FOR HARD DISK MODULE

(71) Applicant: ZHENGZHOU YUNHAI INFORMATION TECHNOLOGY CO., LTD., Zhengzhou, Henan (CN)

(72) Inventors: Xiaodong Yang, Henan (CN); Shuo Zhang, Henan (CN)

(73) Assignee: ZHENGZHOU YUNHAI INFORMATION TECHNOLOGY CO., LTD., Zhengzhou, Henan (CN)

( * ) Notice: Subject to any disclaimer, the term of this patent is extended or adjusted under 35 U.S.C. 154(b) by 0 days.

(21) Appl. No.: 16/475,091

(22) PCT Filed: Jun. 13, 2018

(86) PCT No.: PCT/CN2018/091058
§ 371 (c)(1),
(2) Date: Jun. 29, 2019

(87) PCT Pub. No.: WO2019/029262
PCT Pub. Date: Feb. 14, 2019

(65) Prior Publication Data
US 2019/0333544 A1 Oct. 31, 2019

(30) Foreign Application Priority Data

Aug. 7, 2017 (CN) .......................... 2017 1 0666417

(51) Int. Cl.
*H05K 7/00* (2006.01)
*G11B 33/12* (2006.01)
(Continued)

(52) U.S. Cl.
CPC .......... *G11B 33/124* (2013.01); *G06F 1/1658* (2013.01); *G06F 1/187* (2013.01); *G11B 33/0461* (2013.01); *H05K 7/1405* (2013.01)

(58) Field of Classification Search
None
See application file for complete search history.

(56) References Cited

U.S. PATENT DOCUMENTS

| | | | | |
|---|---|---|---|---|
| 5,340,340 A | * | 8/1994 | Hastings | G06F 1/181 312/223.1 |
| 7,513,693 B2 | * | 4/2009 | Wang | G02B 6/3897 385/56 |

(Continued)

FOREIGN PATENT DOCUMENTS

| | | |
|---|---|---|
| CN | 2715221 Y | 8/2005 |
| CN | 200997102 Y | 12/2007 |

(Continued)

OTHER PUBLICATIONS

International Search Report for PCT/CN2018/091058 dated Sep. 7, 2018, ISA/CN.

(Continued)

*Primary Examiner* — Jinhee J Lee
*Assistant Examiner* — Rashen E Morrison
(74) *Attorney, Agent, or Firm* — Yue (Robert) Xu; Apex Attorneys at Law, LLP

(57) ABSTRACT

A tool-less quick assembly and disassembly device for a hard disk module, including a mounting rack, a hard disk accommodation cavity being provided on the mounting rack, a multilayer hard disk support structure being provided on the mounting rack inside the hard disk accommodation cavity, and a baffle being provided on the mounting rack at a position corresponding to each layer of the hard disk support structure, the baffle being provided at the end part of one end of the mounting rack, and the other end of the (Continued)

mounting rack being an opening end; elastic positioning mechanisms are provided on both sides of the mounting rack; elastic clamping mechanisms are provided at the bottom of the mounting rack. The invention can enable multiple hard disks to be completely assembled and disassembled without tools, has a simple structure, is easy to assemble and disassemble.

7 Claims, 4 Drawing Sheets

(51) Int. Cl.
   *G06F 1/16* (2006.01)
   *G06F 1/18* (2006.01)
   *G11B 33/04* (2006.01)
   *H05K 7/14* (2006.01)

(56) References Cited

U.S. PATENT DOCUMENTS

| | | | |
|---|---|---|---|
| 9,727,099 B1 * | 8/2017 | Hastings | G06F 1/187 |
| 2002/0044427 A1 | 4/2002 | Le et al. | |
| 2003/0171016 A1 * | 9/2003 | Bright | H05K 9/0015 |
| | | | 439/160 |
| 2006/0002078 A1 | 1/2006 | Jing | |
| 2006/0034048 A1 * | 2/2006 | Xu | G06F 1/184 |
| | | | 361/679.32 |
| 2008/0305687 A1 * | 12/2008 | Zhang | G11B 33/12 |
| | | | 439/638 |
| 2009/0059506 A1 * | 3/2009 | Yeh | G06F 1/187 |
| | | | 361/679.34 |
| 2010/0294902 A1 | 11/2010 | Zhang | |
| 2012/0155012 A1 | 6/2012 | Guo | |
| 2013/0057127 A1 | 3/2013 | Chen | |
| 2013/0279129 A1 * | 10/2013 | Xie | G06F 1/16 |
| | | | 361/752 |

FOREIGN PATENT DOCUMENTS

| | | |
|---|---|---|
| CN | 201100886 Y | 8/2008 |
| CN | 101894580 A | 11/2010 |
| CN | 201945929 U | 8/2011 |
| CN | 102541198 A | 7/2012 |
| CN | 102981571 A | 3/2013 |
| CN | 203133712 U | 8/2013 |
| CN | 203870528 U | 10/2014 |
| CN | 204009713 U | 12/2014 |
| CN | 204242066 U | 4/2015 |
| CN | 204731707 U | 10/2015 |
| CN | 205050559 U | 2/2016 |
| CN | 105511568 A | 4/2016 |
| CN | 205594547 U | 9/2016 |
| CN | 107464576 A | 12/2017 |

OTHER PUBLICATIONS

The 1st Office Action regarding Chinese Patent Application No. CN201710666417.5, dated Feb. 2, 2019. English Translation Provided by http://globaldossier.uspto.gov.

The Notification to Grant Patent Right for Invention regarding Chinese Patent Application No. CN201710666417.5, dated Apr. 29, 2019. English Translation Provided by http://globaldossier.uspto.gov.

* cited by examiner

TOOL-LESS QUICK ASSEMBLY AND DISASSEMBLY DEVICE FOR HARD DISK MODULE

The present application is a National Phase entry of PCT Application No. PCT/CN2018/091058, filed on Jun. 13, 2018, which claims priority to Chinese Patent Application No. 201710666417.5, titled "TOOL-LESS QUICK ASSEMBLY AND DISASSEMBLY DEVICE FOR HARD DISK MODULE", filed on Aug. 7, 2017 with the China National Intellectual Property Administration, which are incorporated herein by reference in their entireties.

FIELD

The present disclosure relates to the technical field of server installation jigs, in particular to a tool-less quick assembly and disassembly device for a hard disk module.

BACKGROUND

World is now in the era of big data. The demand for data traffic in the Internet and Telecommunications industries is increasing, and the demand for server products is also increasing. In order to maintain equipment more efficiently, many components in the server equipment are designed into tool-less ones. A hard disk is a core component of data storage, and the usage thereof is increasing year by year, therefore it is of great significance to quickly replace faulty hard disks.

At present, there are a variety of tool-less hard disk assembly and disassembly structures, but they are complicated in structure and inconvenient to use, which greatly affects the removal efficiency of the hard disk. Moreover, these tool-less hard disk assembly and disassembly structures only support the fixing of one single hard disk. If these structures are adopted to satisfy the fixation of multiple hard disks (multiple hard disks form a hard disk module), it results in a large volume and a large occupied space, and the operation is not completely tool-less.

SUMMARY

An object of the embodiments of the present disclosure is to provide a tool-less quick assembly and disassembly device for a hard disk module, which is convenient to use, allows the operation of the hard disk module to be completely tool-less, and can improve the space utilization rate of the server.

In order to address the above technical issues, the following technical solutions are provided according to the embodiments of the present disclosure. A tool-less quick assembly and disassembly device for a hard disk module includes a mounting rack. The mounting rack is provided with a hard disk receiving cavity and a hard disk support structures, having multiple layers, in the hard disk receiving cavity. The mounting rack is provided with a barrier at each position corresponding to each layer of the hard disk support structure. The barrier is arranged at one end of the mounting rack, and the other end of the mounting rack is an open end.

An elastic positioning mechanism is arranged on each of two sides of the mounting rack, and a bottom of the mounting rack is provided with an elastic latching mechanism.

Optionally, the elastic positioning mechanism includes a positioning elastic piece fixedly mounted to an outer side of the mounting rack. Two ends of the positioning elastic piece are provided with multiple positioning pins arranged in columns, and the mounting rack is provided with positioning holes at positions corresponding to the positioning pins. Each layer of the hard disk support structure corresponds to two positioning pins located at two ends of the positioning elastic piece, and the two positioning pins are arranged in rows and located above the hard disk support structure. The positioning pins pass through the positioning holes and extend into the hard disk receiving cavity when in an initial state; and the elastic positioning mechanism further includes a sliding plate slidably arranged between the positioning elastic piece and the mounting rack, both ends of the sliding plate are provided with a first bump extending toward the positioning elastic piece, the positioning elastic piece is provided with a second bump at a position corresponding to the first bump, and the second bump extends toward the first bump.

Optionally, the mounting rack is provided with an internal-thread stud protruding from an outer surface of the mounting rack, and the positioning elastic piece is fixedly mounted to the internal-thread stud by a screw; and the sliding plate is provided with an elongated hole extending along a length direction of the sliding plate, and the internal-thread stud is located within the elongated hole.

Optionally, the positioning elastic piece located under the screw is provided with a position-limiting protrusion, and the position-limiting protrusion extends toward the mounting rack.

Optionally, the mounting rack is provided with a position-limiting stopper on both sides of the sliding plate.

Optionally, the elastic latching mechanism includes two connecting portions arranged on the bottom of the mounting rack, and the connecting portions are formed in a bending manner on the mounting rack toward the hard disk receiving cavity;

each of the connecting portions is provided with a latching elastic piece, the latching elastic piece is provided with a protruding latching block, and the latching block protrudes away from the hard disk receiving cavity; and each of the connecting portions is further provided with multiple protruding positioning blocks, a protruding direction of the positioning block is consistent with that of the latching block, and the positioning block is provided with an annular positioning groove.

Optionally, the latching elastic piece protrudes from an end portion of the mounting rack, and is located at the same end of the mounting rack as the barrier;

a handle is connected to a protruding end of each of the two latching elastic pieces; and a handle support plate is arranged at a top of the mounting rack, and a sectional shape of the handle support plate is of an arc shape.

Optionally, the hard disk support structure includes multiple support plates arranged in a same plane and located in the hard disk receiving cavity, and the multiple support plates are stamped on the mounting rack in a bending manner, and the support plates are distributed on two sides of the mounting rack.

Optionally, each layer of the hard disk support structure corresponds to two barriers, and the two barriers are respectively arranged on two sides of the mounting rack.

Optionally, the mounting rack is provided with multiple through holes, and the positioning elastic piece is provided with multiple oval holes arranged in parallel; and a side of the sliding plate close to the top of the mounting rack is provided with a bending portion bent toward the positioning elastic piece.

Due to the above technical solutions, the beneficial effects of the tool-less quick assembly and disassembly device for a hard disk module provided by the embodiments of the present disclosure are as follows.

The mounting rack is provided with the hard disk receiving cavity and a hard disk support structure, having multiple layers, located in the hard disk receiving cavity. The barrier is provided at the corresponding position of each layer of the hard disk support structure. The barrier is arranged at one end of the mounting rack, and the other end of the mounting rack is an open end. The elastic positioning mechanism is arranged on each of the two sides of the mounting rack. The bottom of the mounting rack is provided with the elastic latching mechanism. Based on the above structure, multiple hard disks are placed in the hard disk receiving cavity by the tool-less quick assembly and disassembly device for a hard disk module through the open end of the mounting rack in specific applications, until the hard disks abut against the barriers. During the above process, the hard disks are supported by the hard disk support structures, and each hard disk corresponds to a layer of hard disk support structure. Thereafter, the hard disks are positioned on the hard disk support structures by the elastic positioning mechanism, and then the tool-less quick assembly and disassembly device for a hard disk module is fixed onto the base or the body of the server by the elastic latching mechanism, thereby realizing the installation of the hard disk module by the elastic latching mechanism.

In summary, the tool-less quick assembly and disassembly device for a hard disk module allows complete tool-less assembly and disassembly of multiple hard disks (that is, a hard disk module). The device has a simple structure and is convenient to assemble and disassemble, which greatly improves the work efficiency (high assembly efficiency at the production stage, and high disassembly efficiency at the maintenance stage), and is easy to maintain. Besides, the tool-less quick assembly and disassembly device for a hard disk module has a small volume and a low space occupancy, which effectively improves the space utilization rate of the space inside the server.

Besides, the elastic positioning mechanism includes a positioning elastic piece fixedly mounted to an outer side of the mounting rack. Two ends of the positioning elastic piece are provided with multiple positioning pins arranged in columns, and the mounting rack is provided with positioning holes at positions corresponding to the positioning pins. Each layer of the hard disk support structure corresponds to two positioning pins located at two ends of the positioning elastic piece, and the two positioning pins are arranged in rows and located above the hard disk support structure. When in the initial state, the positioning pins pass through the positioning holes and extend into the hard disk receiving cavity. The elastic positioning mechanism further includes the sliding plate slidably mounted between the positioning elastic piece and the mounting rack. Both ends of the sliding plate are provided with the first bump extending toward the positioning elastic piece, and the positioning elastic piece is provided with a second bump at a position corresponding to the first bump. The second bump extends toward the first bump. Based on the above structure, during the usage of the elastic positioning mechanism, the sliding plate is operated to slide before the hard disks are placed into the hard disk receiving cavity. During the sliding process, the first bump and the second bump abut against each other, so that the two ends of the positioning elastic piece are lifted, and the positioning pins are not located in the hard disk receiving cavity, and then the hard disks can be placed into the hard disk receiving cavity. After all the hard disks are placed on the hard disk support structures, the slide plate is operated to return to the former position, and the first bump and the second bump no longer abut against each other. Moreover, the two ends of the positioning elastic piece rebound due to the elastic force of the positioning elastic piece, and the positioning pins pass through the positioning holes and are inserted into the hard disks (adaptive holes corresponding to the positioning pins may be arranged on the hard disks in advance), thereby realizing the positioning of the hard disk module on the mounting rack. The above structure is simple, the assembly and disassembly of the hard disks are fast and convenient, which establishes the foundation for completely tool-less assembly and disassembly.

The mounting rack is provided with the internal-thread stud protruding from the outer surface of the mounting rack, and the positioning elastic piece is fixedly mounted to the internal-thread stud by the screw. The above structure, through which the installation of the positioning elastic pieces is realized, is simple and convenient to install. The sliding plate is provided with the elongated hole extending along the length direction of the sliding plate, and the internal-thread stud is located within the elongated hole, which establishes a foundation for the sliding of the sliding plate by providing the elongated hole, and realizes the assembly of the sliding plate between the mounting rack and the positioning elastic piece by the cooperation of the internal-thread stud and the elongated hole.

Since the positioning elastic piece located under the screw is provided with the position-limiting protrusion and the position-limiting protrusion extends toward the mounting rack, the limiting protrusion plays the role of stopping the sliding plate and prevents the sliding plate from moving downward.

Since the position-limiting stopper is arranged on the mounting rack on both sides of the sliding plate, the sliding plate is prevented from rotating around the internal-thread stud by the position-limiting stopper. The rotation may affect the action of positioning elastic piece.

The elastic latching mechanism includes two connecting portions arranged on the bottom of the mounting rack, each of the connecting portions is provided with the latching elastic piece, the latching elastic piece is provided with the protruding latching block, and the latching block protrudes away from the hard disk receiving cavity. Each of the connecting portions is further provided with multiple protruding positioning blocks, the protruding direction of the positioning block is consistent with that of the latching block, and the positioning block is provided with the annular positioning groove. Based on the above structure, when the tool-less quick assembly and disassembly device for a hard disk module is assembled, the substantive portion of the base or the body is restrained by the annular positioning grooves of the positioning blocks, thereby realizing the positioning of the tool-less quick assembly and disassembly device for a hard disk module, and then the latching block are latched in latching grooves on the base or the body by the elastic deformation of the latching elastic piece, thereby realizing the fixation of the tool-less quick assembly and disassembly device for a hard disk module after the positioning. The tool-less quick assembly and disassembly device for a hard disk module is prevented from being displaced and being detached from the base or the body. The structure is simple, and has a good positioning and fixing effect, which similarly establishes the foundation for completely tool-less assembly and disassembly.

Since the latching elastic piece protrudes from an end portion of the mounting rack and are located at the same end of the mounting rack with the barrier, the assembly and disassembly of the hard disks in the tool-less quick assembly and disassembly device for a hard disk module are not affected. Since the handle is connected to the protruding end of each of the two latching elastic piece and the handle support plate is arranged at the top of the mounting rack, the handle support plate provides a supporting force for the handle in practical applications. When the hard disks are disassembled, the latching block can be detached from the base by applying force onto the handle, which greatly improves the disassembly efficiency of the tool-less quick assembly and disassembly device for a hard disk module on the base. Since the sectional shape of the handle support plate is an arc, the arc-shaped structure can not only support the handle, but also do not affect the latching of the latching block (the elastic piece is elastically deformed, and there are displacement changes at the latching block).

Since the hard disk support structure includes multiple support plates arranged in a same plane and located in the hard disk receiving cavity, and the multiple support plates are stamped on the mounting rack in a bending manner, and the support plates are distributed on two sides of the mounting rack, the hard disks are supported by the support plates during use. Besides, the support plates are simple to form and easy to process, and no additional support members are required.

Since each layer of the hard disk support structure corresponds to two barriers, and the two barriers are respectively arranged on two sides of the mounting rack, an end portion of the hard disk is blocked by the barriers on the two sides of the mounting rack to prevent the hard disk from tilting on the supporting plates, which establishes the foundation for the smooth insertion of the positioning pins into the hard disk.

Since the mounting rack is provided with multiple through holes, and the positioning elastic piece is provided with multiple oval holes arranged in parallel, the through holes and the oval holes not only facilitate the heat dissipation of the hard disk, but also greatly reduce the self-weight of the tool-less quick assembly and disassembly device for a hard disk module. Since the side of the sliding plate close to the top of the mounting rack is provided with the bending portion bent toward the positioning elastic piece, the bending portion facilitates the worker operating the sliding plate, and also prevents the sliding plate from sliding down by itself (if the sliding plate slides down by itself, the bent portion will be supported on the positioning elastic piece).

Figure 1:
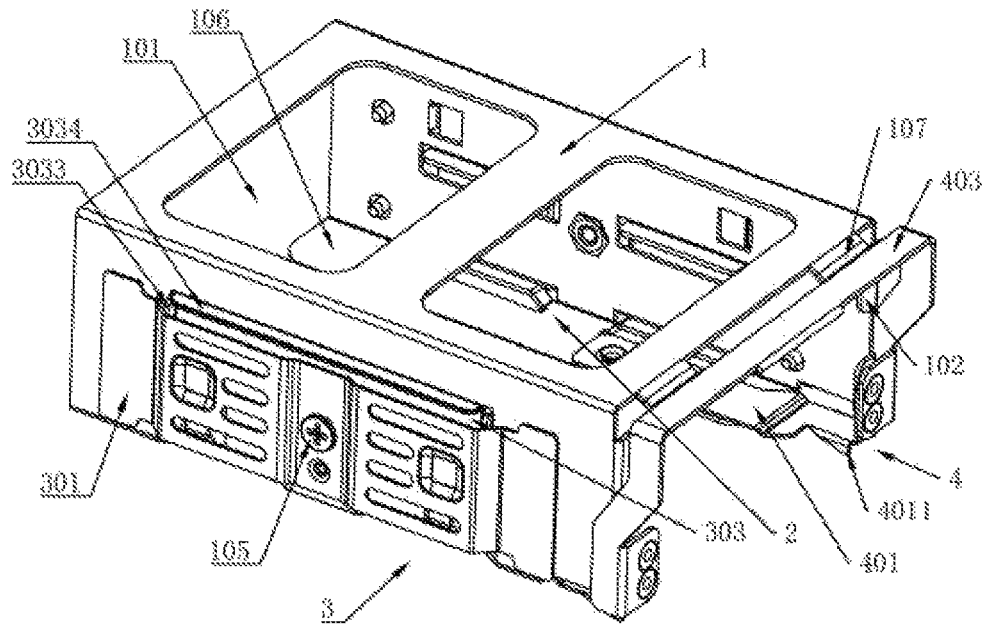
FIG. 1 is a schematic structural view of an embodiment according to the present disclosure.

The reference numerals are listed as follows.

1 mounting rack; 101 hard disk receiving cavity; 102 barrier; 103 positioning hole; 104 internal-thread stud; 105 screw; 106 connecting portion; 107 handle support plate; 108 through hole; 2 hard disk support structure; 201 support plate; 3 elastic positioning mechanism; 301 positioning elastic piece; 3011 second bump; 3012 position-limiting protrusion; 302 positioning pin; 303 sliding plate; 3031 first bump; 3032 elongated hole; 3033 position-limiting stopper; 3034 bending portion; 304 oval hole; 4 elastic latching mechanism; 401 latching elastic piece; 4011 latching block; 402 positioning block; 4021 annular positioning groove; 403 handle; 5 base; 501 hardy hole; 502 latching groove.

DETAILED DESCRIPTION OF THE EMBODIMENTS

In order to make the objectives, technical solutions, and advantages of the present disclosure clearer, the present disclosure is further described in detail hereinafter with reference to the drawings and embodiments. It should be understood that the embodiments described herein are only intended to explain the present disclosure rather than limiting the present disclosure.

As shown in FIG. 1, a tool-less quick assembly and disassembly device for a hard disk module includes a mounting rack 1. The mounting rack 1 is provided with a hard disk receiving cavity 101 and a hard disk support structure 2 having multiple layers located in the hard disk receiving cavity 101. The mounting rack 1 is provided with a barrier 102 at each position corresponding to each layer of the hard disk support structure 2. The barrier 102 is arranged at one end of the mounting rack 1, and the other end of the mounting rack 1 is an open end. An elastic positioning mechanism 3 is arranged on each of two sides of the mounting rack 1. A bottom of the mounting rack 1 is provided with an elastic latching mechanism 4.

Figure 3:
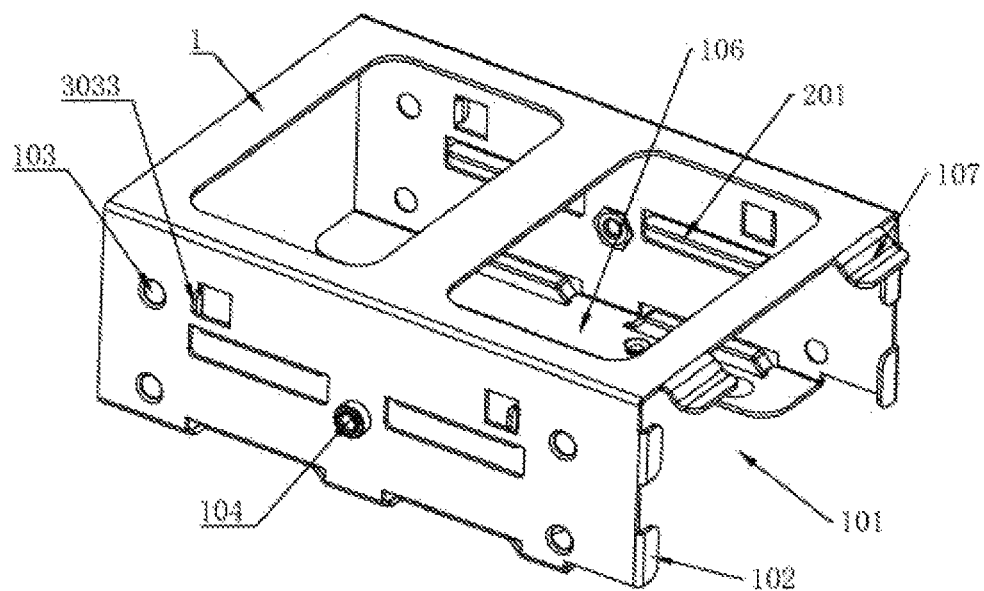
FIG. 3 is a schematic structural view of the mounting rack shown in FIG. 1.
Figure 4:
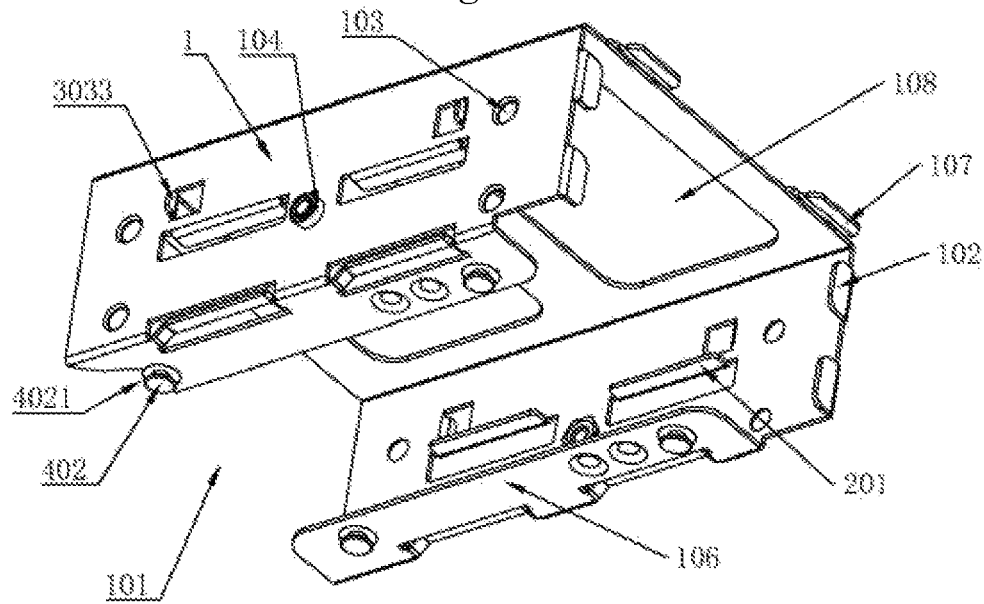
FIG. 4 is another schematic structural view of the mounting rack in FIG. 3, which is viewed from another angle.
Figure 5:
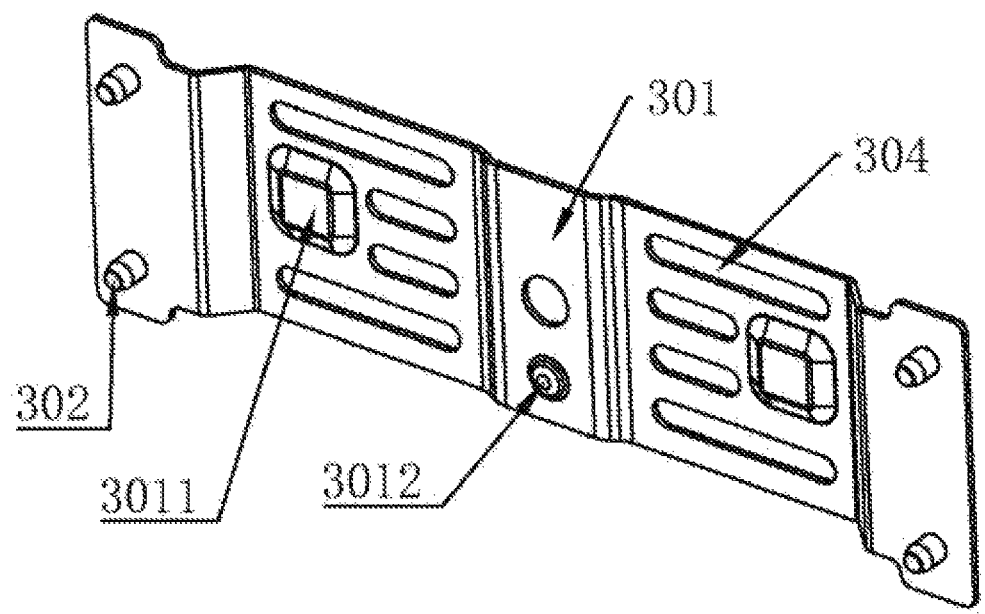
FIG. 5 is a schematic structural view of the positioning elastic piece shown in FIG. 1.
Figure 6:
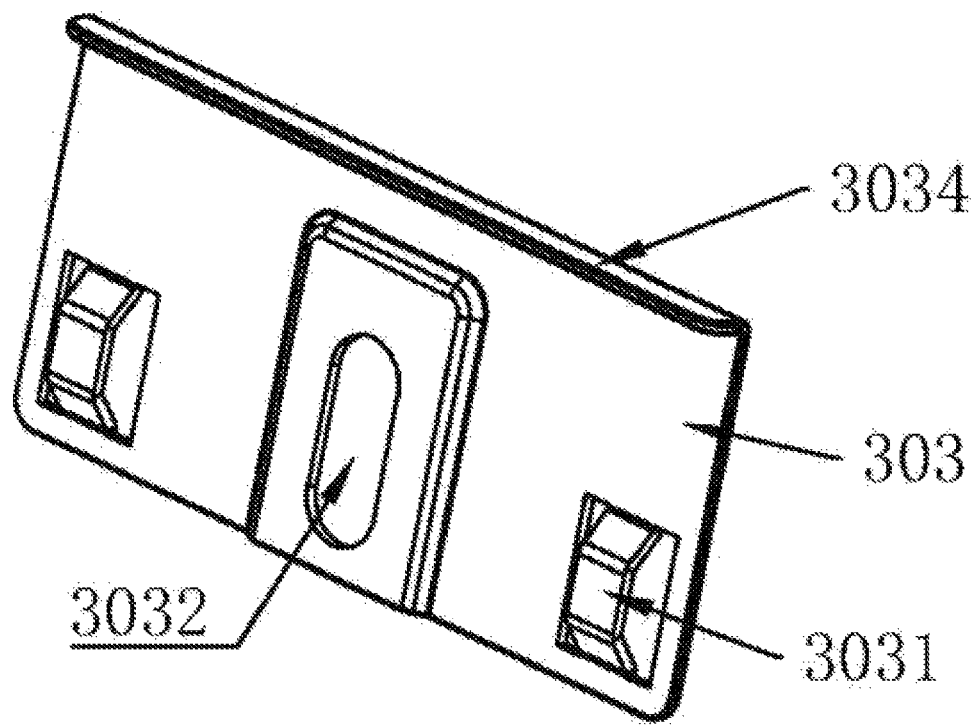
FIG. 6 is a schematic structural view of the sliding plate shown in FIG. 1.

As is shown in FIGS. 1 to 6, the elastic positioning mechanism 3 includes a positioning elastic piece 301 fixedly mounted to an outer side of the mounting rack 1. Two ends of the positioning elastic piece 301 are provided with multiple positioning pins 302 arranged in columns, and the mounting rack 1 is provided with positioning holes 103 at positions corresponding to the positioning pins 302. An outer diameter of the positioning pin 302 is smaller than an inner diameter of the positioning hole 103. Each layer of the hard disk support structure 2 corresponds to two positioning pins 302 located at two ends of the positioning elastic piece 301, and the two positioning pins 302 are arranged in rows and located above the hard disk support structure 2. When in an initial state, the positioning pins 302 pass through the positioning holes 103 and extend into the hard disk receiving cavity 101. The elastic positioning mechanism further includes a sliding plate 303 slidably mounted between the positioning elastic piece 301 and the mounting rack 1. Both ends of the sliding plate 303 are provided with a first bump 3031 extending toward the positioning elastic piece 301 and the positioning elastic piece 301 is provided with a second bump 3011 at a position corresponding to the first bumps 3031. The second bump 3011 extends toward the first bump 3031 (as shown in FIGS. 5 and 6). The second bump 3011 and the first bump 3031 are of a trapezoid with an inclined face, so as to realize the abutting and cooperation of the second bump 3011 and the first bump 3031 d through the inclined face during the sliding of the sliding plate 303.

Figure 2:
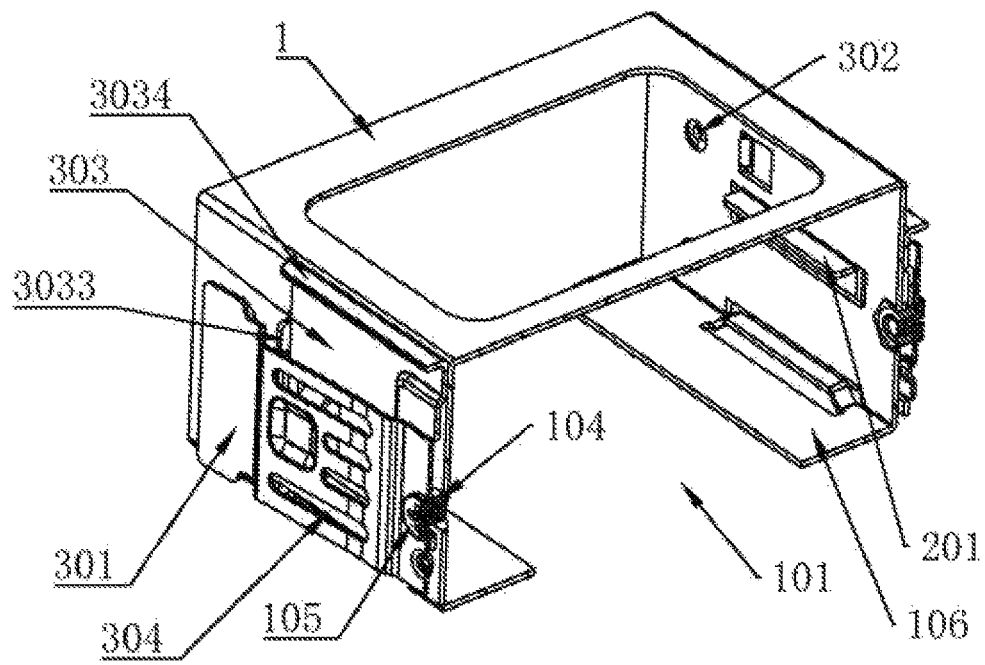
FIG. 2 is a schematic sectional view of FIG. 1.

The mounting rack 1 is provided with an internal-thread stud 104 protruding from an outer surface of the mounting rack 1, and the positioning elastic piece 301 is fixedly mounted to the internal-thread stud 104 by a screw 105. The sliding plate 303 is provided with an elongated hole 3032 extending along a length direction of the sliding plate 303, and the internal-thread stud 104 is located within the elongated hole 3032 (as shown in FIGS. 2 and 6).

The positioning elastic piece 301 located under the screw 105 is provided with a position-limiting protrusion 3012, and the position-limiting protrusion 3012 extends toward the mounting rack 1 (as shown in FIG. 5).

A position-limiting stopper 3033 is arranged on the mounting rack 1 on each of both sides of the sliding plate 303, and the position-limiting stopper 3033 is formed on the mounting rack 1 in a stamping and bending manner (as shown in FIGS. 3 and 4).

Figure 7:
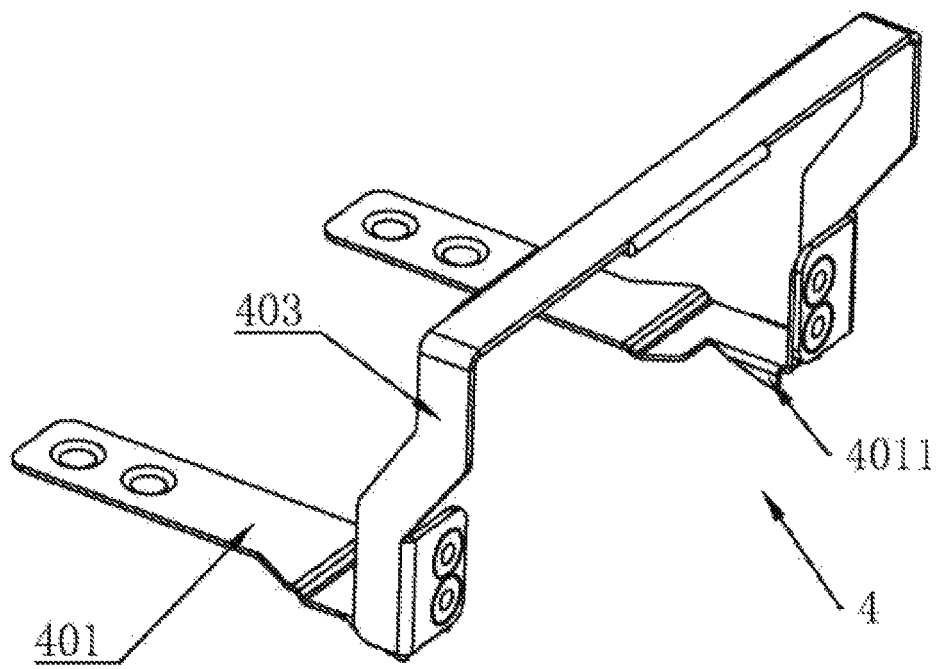
FIG. 7 is a schematic structural view of the latching elastic pieces and the handle shown in FIG. 1 when the two are in cooperation.

As shown in FIGS. 1 and 7, the elastic latching mechanism 4 includes two connecting portions 106 arranged on a bottom of the mounting rack 1, and each of the two connecting portions 106 is formed in a bending manner on the mounting rack 1 toward the hard disk receiving cavity 101. A latching elastic piece 401 is fixedly arranged on each of the two connecting portions 106 through a connecting member (for example, a connecting bolt), and the latching elastic piece 401 is provided with a protruding latching block 4011. The latching block 4011 protrudes away from the hard disk receiving cavity 101. A shape of the latching block 4011 is preferably of a trapezoidal shape so as to smoothly engage and disengage with a base 5. Each of the connecting portions 106 is further provided with multiple protruding positioning blocks 402, a protruding direction of each of the positioning blocks 402 is consistent with that of the latching block 4011, and the positioning block 402 is provided with an annular positioning groove 4021. The structure of the positioning block 402 and the annular positioning groove 4021 may be replaced with a push pin.

The latching elastic piece 401 protrudes from an end portion of the mounting rack 1, and is located at the same end of the mounting rack 1 with the barrier 102. A handle 403 is connected to a protruding end of each of the two latching elastic pieces 401. A handle support plate 107 is arranged at a top of the mounting rack 1, and a sectional shape of the handle support plate 107 is of an arc shape.

Figure 8:
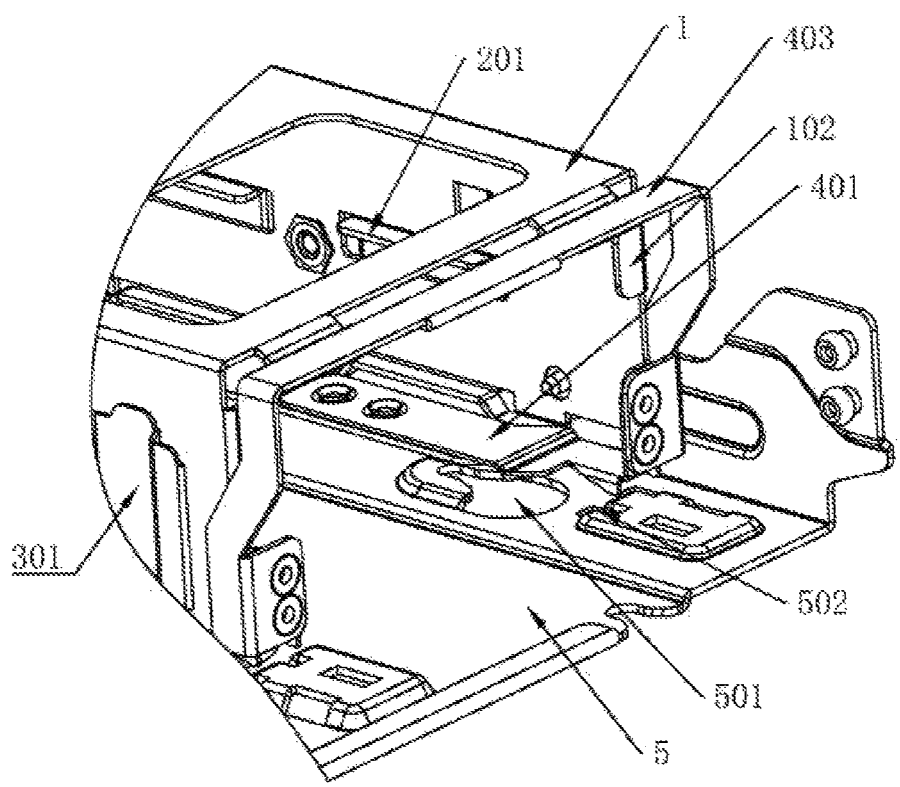
FIG. 8 is a schematic structural view of the device shown in FIG. 1 when the device is in an applied state.

As shown in FIG. 8, in the present solution, when the tool-less quick assembly and disassembly device for a hard disk module is used for installation, firstly, hardy holes 501 and latching grooves 502 adapted to the latching blocks 4011 (the hardy holes 501 and the latching grooves 502 are formed to engage with the positioning blocks 402 and the latching blocks 4011) are arranged on the base 5 (the base 5 may also be a server body), then the positioning blocks 402 are placed in large holes of the hardy holes 501, and then moved to small holes of the hardy holes 501, until substantive portions in the areas of the small holes of the hardy holes 501 are constrained in the annular positioning grooves 4021, which realizes the positioning of the tool-less quick assembly and disassembly device for a hard disk module. Then the latching blocks 4011 are latched in the latching grooves 502 through elastic deformation of the latching elastic pieces 401, which realizes the fixing of the tool-less quick assembly and disassembly device for a hard disk module after the positioning, and prevents the tool-less quick assembly and disassembly device for a hard disk module from being displaced and being detached from the hardy holes 501.

The hard disk support structure 2 includes multiple support plates 201 arranged in a same plane and located in the hard disk receiving cavity 101, and the multiple support plates 201 are stamped on the mounting rack 1 in a bending manner, and the support plates 201 are distributed on two sides of the mounting rack 1 (as shown in FIGS. 1 and 4).

Each layer of the hard disk support structure 2 corresponds to two barriers 102, the barriers 102 are formed on the mounting rack 1 in a bending manner, and the two barriers 102 are respectively arranged on two sides of the mounting rack 1 (as shown in FIGS. 3 and 4).

The mounting rack 1 is provided with multiple through holes 108 (as shown in FIGS. 1 to 4). The positioning elastic piece 301 is provided with multiple oval holes 304 arranged in parallel, and the oval holes 304 are communicate with the holes formed on the mounting rack 1 after the support plates 201 are stamped and bent, thereby further improving the heat dissipation of the hard disk (as shown in FIGS. 1, 2 and 5). A side of the sliding plate 303 close to the top of the mounting rack 1 is provided with a bending portion 3034 bent toward the positioning elastic piece 301 (as shown in FIGS. 1, 2 and 6).

The foregoing shows only preferred embodiments of the present disclosure and is not intended to limit the present disclosure, and any modifications, equivalent substitutions and improvements within the spirit and the principle of the present disclosure are included within the protection scope of the present disclosure.

The invention claimed is:

1. A tool-less quick assembly and disassembly device for a hard disk module, comprising a mounting rack, wherein the mounting rack is provided with a hard disk receiving cavity and a hard disk support structure, having a plurality of layers, arranged in the hard disk receiving cavity, the mounting rack is provided with a barrier at a corresponding position of each layer of the hard disk support structure, the barrier is arranged at one end of the mounting rack, and the other end of the mounting rack is an open end;

an elastic positioning mechanisms is arranged on each of two sides of the mounting rack; and an elastic latching mechanism is arranged at a bottom of the mounting rack; and wherein the elastic positioning mechanism comprises a positioning elastic piece fixedly arranged on an outer side of the mounting rack, two ends of the positioning elastic piece are provided with a plurality of positioning pins arranged in columns, positioning holes are arranged on the mounting rack at positions corresponding to the plurality of positioning pins, each layer of the hard disk support structure corresponds to two positioning pins located at two ends of the positioning elastic piece, and the two positioning pins are arranged in rows and located above the hard disk support structure; the positioning pins pass through the positioning holes and extend into the hard disk receiving cavity when in an initial state; and the elastic positioning mechanism further comprises a sliding plate slidably arranged between the positioning elastic piece and the mounting rack, both ends of the sliding plate are provided with a first bump extending toward the positioning elastic piece, the positioning elastic piece is provided with a second bump at a position corresponding to the first bump, and the second bump extends toward the first bump; and wherein, the mounting rack is provided with an internal-thread stud protruding from an outer surface of the mounting rack, and the positioning elastic piece is fixedly mounted to the internal-thread stud by a screw; and the sliding plate is provided with an elongated hole extending along a length direction of the sliding plate, and the internal-thread stud is located within the elongated hole.

2. The tool-less quick assembly and disassembly device for a hard disk module according to claim 1, wherein the positioning elastic piece located under the screw is provided with a position-limiting protrusion, and the position-limiting protrusion extends toward the mounting rack.

3. The tool-less quick assembly and disassembly device for a hard disk module according to claim 2, wherein the mounting rack is provided with a position-limiting stopper on both sides of the sliding plate.

4. A tool-less quick assembly and disassembly device for a hard disk module, comprising a mounting rack, wherein the mounting rack is provided with a hard disk receiving cavity and a hard disk support structure, having a plurality of layers, arranged in the hard disk receiving cavity, the mounting rack is provided with a barrier at a corresponding position of each layer of the hard disk support structure, the barrier is arranged at one end of the mounting rack, and the other end of the mounting rack is an open end;

an elastic positioning mechanisms is arranged on each of two sides of the mounting rack; and an elastic latching mechanism is arranged at a bottom of the mounting rack, wherein the elastic latching mechanism comprises two connecting portions arranged on the bottom of the mounting rack, and the connecting portions are formed in a bending manner on the mounting rack toward the hard disk receiving cavity;

each of the connecting portions is provided with a latching elastic piece, the latching elastic piece is provided with a protruding latching block, and the latching block protrudes away from the hard disk receiving cavity; and each of the connecting portions is further provided with a plurality of protruding positioning blocks, a protruding direction of each of the plurality of positioning block is consistent with a protruding direction of the latching block, and each of the plurality of positioning block is provided with an annular positioning groove.

5. The tool-less quick assembly and disassembly device for a hard disk module according to claim 4, wherein the latching elastic piece protrudes from an end portion of the mounting rack, and is located at a same end of the mounting rack with the barrier;

a handle is connected to a protruding end of each of the two latching elastic piece; and a handle support plate is arranged at a top of the mounting rack, and a sectional shape of the handle support plate is of an arc shape.

6. A tool-less quick assembly and disassembly device for a hard disk module, comprising a mounting rack, wherein the mounting rack is provided with a hard disk receiving cavity and a hard disk support structure, having a plurality of layers, arranged in the hard disk receiving cavity, the mounting rack is provided with a barrier at a corresponding position of each layer of the hard disk support structure, the barrier is arranged at one end of the mounting rack, and the other end of the mounting rack is an open end;

an elastic positioning mechanisms is arranged on each of two sides of the mounting rack; and an elastic latching mechanism is arranged at a bottom of the mounting rack; and wherein the hard disk support structure includes a plurality of support plates arranged in a same plane and located in the hard disk receiving cavity, the plurality of support plates are stamped on the mounting rack in a bending manner, and the support plates are distributed on two sides of the mounting rack, wherein each layer of the hard disk support structure corresponds to two barriers, and the two barriers are respectively arranged on two sides of the mounting rack.

7. The tool-less quick assembly and disassembly device for a hard disk module according to claim 1, wherein the mounting rack is provided with a plurality of through holes; the positioning elastic piece is provided with a plurality of oval holes arranged in parallel; and a side of the sliding plate close to the top of the mounting rack is provided with a bending portion bent toward the positioning elastic piece.

* * * * *